United States Patent
Mikagi

[11] Patent Number: 6,153,507
[45] Date of Patent: Nov. 28, 2000

[54] METHOD OF FABRICATING SEMICONDUCTOR DEVICE PROVIDING EFFECTIVE RESISTANCE AGAINST METAL LAYER OXIDATION AND DIFFUSION

[75] Inventor: Kaoru Mikagi, Tokyo, Japan

[73] Assignee: NEC Corporation, Tokyo, Japan

[21] Appl. No.: 09/006,206

[22] Filed: Jan. 13, 1998

[30] Foreign Application Priority Data

Jan. 13, 1997 [JP] Japan .................................. 9-003541

[51] Int. Cl.[7] .............................................. H01L 21/4763
[52] U.S. Cl. ........................ 438/618; 438/622; 438/633; 438/687; 438/659; 438/629; 438/672
[58] Field of Search ........................... 438/618, 622–624, 438/626, 629, 687, 688, 633, 637–640, 667–668, 672, 659

[56] References Cited

U.S. PATENT DOCUMENTS

| | | | |
|---|---|---|---|
| 5,429,990 | 7/1995 | Liu et al. | 438/624 |
| 5,592,024 | 1/1997 | Aoyama et al. | 257/751 |
| 5,714,418 | 2/1998 | Bai et al. | 438/627 |
| 5,744,394 | 4/1998 | Iguchi et al. | 438/276 |
| 5,817,571 | 10/1998 | Yu et al. | 438/622 |
| 6,004,622 | 12/1999 | Yen et al. | 427/240 |

FOREIGN PATENT DOCUMENTS

| | | |
|---|---|---|
| 63-299250 | 12/1988 | Japan . |
| 3-289156 | 12/1991 | Japan . |
| 7-176612 | 7/1995 | Japan . |
| 7-307338 | 11/1995 | Japan . |

OTHER PUBLICATIONS

Miyazaki et al., "The Fabrication of Double–Level Copper Interconnection Using Dry Etching", Electronic Data Communication Academy Electronics Society Conference, pp. 117–118, C–419, (1995).

T. Takewaki et al., "Cu Interconnect Technology For Sub––quarter–micron ULSIs", Electronic Data Communication Academy Electronics Society Conference, pp. 115–116, C–418, (1995).

*Primary Examiner*—Charles Bowers
*Assistant Examiner*—Thanh Nguyen
*Attorney, Agent, or Firm*—Foley & Lardner

[57] ABSTRACT

There is provided a method of fabricating a semiconductor device, including the steps of forming a first insulating film on a semiconductor substrate, forming a metal wiring layer on the first insulating film, forming a second insulating film over both the first insulating film and the metal wiring layer at a temperature lower than a temperature at which the metal wiring layer is oxidized, implanting impurities into the second insulating film, the impurities having an ability of preventing diffusion of metal of which the metal wiring layer is made, and forming a third insulating film on the second insulating film. The method prevents an increase in electrical resistance of the metal wiring layer, and at the same time, improves oxidation resistance of the metal wiring layer and prevents diffusion of metal into an insulating film surrounding the metal wiring layer. As a result, the method provides long-term reliability and an enhanced fabrication yield to a semiconductor device.

16 Claims, 7 Drawing Sheets

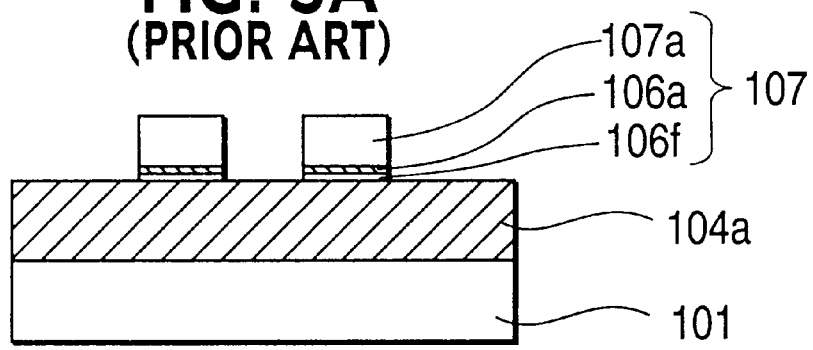
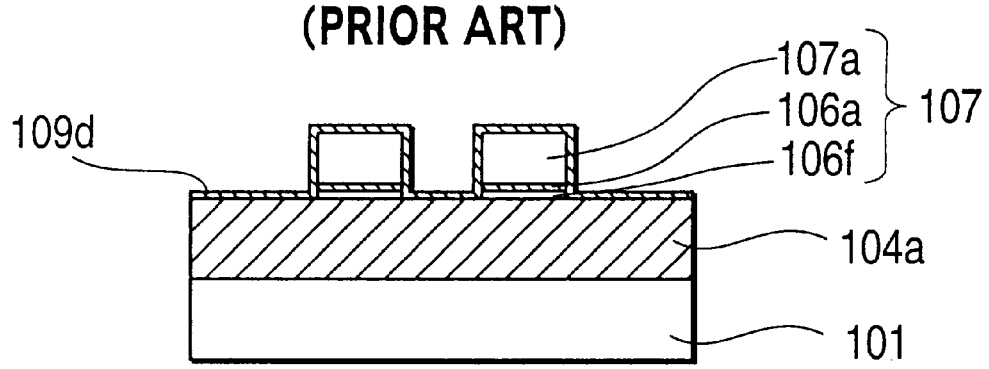
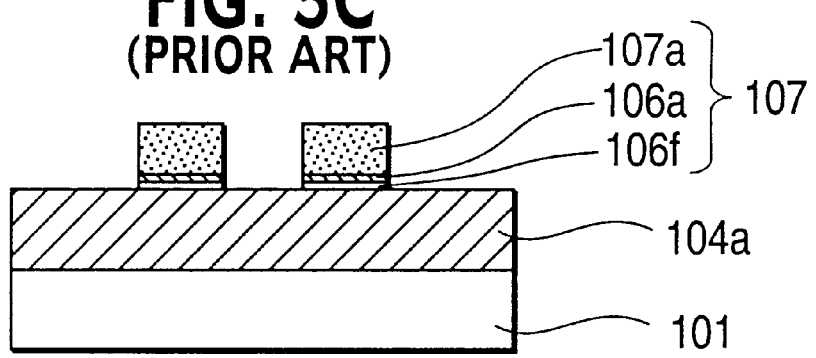

METHOD OF FABRICATING SEMICONDUCTOR DEVICE PROVIDING EFFECTIVE RESISTANCE AGAINST METAL LAYER OXIDATION AND DIFFUSION

BACKGROUND OF THE INVENTION

1. Field of the Invention

The invention relates to a method of fabricating a semiconductor device having a metal wiring layer, such as a copper layer, surrounded by insulating films.

2. Description of the Related Art

A wiring layer in a semiconductor device is usually made of copper (Cu). However, since copper has a rapid oxidation rate, a copper wiring layer has problems, when an insulating film is formed on a copper wiring layer, that a copper wiring layer is oxidized at a surface thereof, and that copper is diffused into an insulating film with the result of an increase of a wiring resistance and wiring leakage. In order to solve those problems associated with a copper wiring layer, there has been suggested a structure for enhancing oxidation resistance in films surrounding a copper wiring layer, and a method of fabricating the structure by T. Takewaki in an article entitled "Cu Interconnect Technology for Subquarter-micron ULSIs", Electronic Data Communication Academy Electronics Society Conference, 1995, C-418, pp. 115–116.

The suggested method is illustrated in FIGS. 1A and 1B. First, as illustrated in FIG. 1A, a silicon dioxide film 104a is formed on a silicon substrate 101. Then, a wiring layer formed of a Cu film 107a is formed on the silicon dioxide film 104a. Then, as illustrated in FIG. 1B, the silicon substrate 101 is exposed to mono-silane ($SiH_4$) gas 109c while being heated, to thereby react copper contained in the Cu film 107a with Si contained in the mono-silane ($SiH_4$) gas. As a result, there is formed a CuxSiy layer or a Cu silicide layer 107c around the Cu film 107a. Herein, x and y indicates positive integers. The thus formed Cu suicide layer 107c prevents oxidation of the Cu film 107a.

In order to prevent oxidation of copper which occurs when an interlayer insulating film is formed on a copper wiring layer, there has been also suggested a method by H. Miyazaki in an article entitled "The fabrication of double-level copper interconnection using dry etching", Electronic Data Communication Academy Electronics Society Conference, 1995, C-419, pp. 117–118. The suggested method is illustrated in FIGS. 2A and 2B.

First, a BPSG film 104c is formed on a silicon substrate 101, and then a first tungsten (W) film 106d, a copper film 107a, and a second tungsten film 106e are formed on the BPSG film 104c in this order. Then, those films 106e, 107a and 106d are successively etched with an insulating film (not illustrated) used as a mask by high-temperature reactive ion etching, employing a mixture gas of silicon tetrachloride ($SiCl_4$), nitrogen ($N_2$) and oxygen ($O_2$) as an etching gas. Thus, as illustrated in FIG. 2A, a copper wiring layer 107 consisting of the multilayered tungsten film 106e, copper film 107a and tungsten film 106d is formed on the BPSG film 104c. Then, as illustrated in FIG. 2B, a silicon dioxide film or plasma-enhanced TEOS oxide film (PE-TEOS oxide film) 108d is formed so as to entirely cover the copper wiring layer 107 therewith by plasma-enhanced chemical vapor deposition (PE-CVD) where a mixture gas of tetra ethoxy silane (TEOS) and oxygen ($O_2$) is employed.

In the above-mentioned high-temperature reactive ion etching, a protection film (not illustrated) made of silicon dioxide or similar material is formed on a sidewall of the copper wiring layer 107. According to Miyazaki, the thus formed protection film and TEOS cause copper oxidation rate to be very slow, and accordingly, oxidation of copper which occurs when an insulating film is formed does not cause a practical problem.

Japanese Unexamined Patent Publication No. 3-289156 has suggested a method of providing an ability of preventing copper diffusion with an insulating film to be formed on a copper wiring layer. The method is illustrated in FIGS. 3A to 3D. First, as illustrated in FIG. 3A, there are formed field oxide films 102 at a surface of a p-type silicon substrate 101 by selective oxidation. Then, an n-type diffusion layer 103 is formed between the field oxide films 102 by ion-implantation. Then, a boron-phosphorus glass (BPSG) film 104c having a thickness of 300 nm and containing boron at 1.0 mol % and phosphorus at 4.0 mol % is formed entirely over the substrate 101, followed by annealing at 850° C. for 20 minutes in nitrogen atmosphere. Then, an interconnection contact hole 105b is open throughout the BPSG film 104c so that the n-type diffusion layer 103 appears.

Then, as illustrated in FIG. 3B, a titanium nitride (TiN) film 106a and a copper (Cu) film 107a are formed by sputtering over the product of FIG. 3A. The TiN film 106a has a thickness of 100 nm, and the Cu film 107a has a thickness of 500 nm. Then, the films 106a and 107a are dry-etched using $BCl_3$ gas to thereby form a patterned Cu/TiN wiring layer.

Then, as illustrated in FIG. 3C, a PSG film 108b having a thickness of 1000 nm and containing phosphorus at 1.2 mol % is formed over the produce of FIG. 3B by chemical vapor deposition (CVD). Then, an interconnection contact hole 105c is formed throughout the PSG film 108b.

Then, as illustrated in FIG. 3D, a 100 nm thick TiN film 106c and a 500 nm thick Cu film 107b are formed over the product of FIG. 3C by sputtering, followed by dry etching, using $BCl_3$ gas, to thereby form a Cu/TiN wiring layer. Then, there is formed as an uppermost layer a PSG film 108c having a thickness of 1000 nm and containing phosphorus at 1.2 mol %.

The inventor measured a leak current at pn junction between the n-type diffusion layer 103 and the p-type silicon substrate 101. The result was that the same performance as that of an Al-Si electrode was obtained. According to the Publication, one of the following films may be employed in place of the PSG film 108c:

(a) a $SiO_2$ film formed by sputtering,
(b) a $SiO_2$ film formed by plasma-enhanced CVD, or
(c) a multi-layered structure comprising silicone resin formed by either phosphorus ion implantation into SiN or SiON, or annealing in $POCl_3$ atmosphere, and a $SiO_2$ film containing no phosphorus.

Japanese Unexamined Patent Publication No. 7-176612 has suggested a semiconductor device and a method of fabricating the same for the purpose of prevention of oxidation at a surface of a copper wiring layer, prevention of an increase in connection resistance, and higher speed operation of a circuit. FIGS. 4A to 4C illustrate steps of the suggested method.

First, as illustrated in FIG. 4A, an about 500 nm thick silicon dioxide film 104a is formed on a silicon substrate 101. Then, there are deposited a 50 nm thick Ti film 106f, a 100 nm thick TiN film 106a, and an about 800 nm thick Cu film 107a on the silicon dioxide film 104a in this order by sputtering. Then, the thus deposited Ti, TiN and Cu films 106f, 106a and 104a are etched in a conventional manner to thereby form a wiring layer 107.

Then, as illustrated in FIG. 4B, a fluorine (F) containing silicon dioxide film 108e having a thickness of about 500 nm is formed over the wiring layer 107 and the silicon dioxide film 104a by plasma-enhanced CVD. The conditions for plasma-enhanced CVD are as follows.

Source gas: triethoxyfluorosilane $(FSi(OC_2H_5)_3)+O_2$
Pressure: 10 Torr
Substrate Temperature: 50° C.

After application of silanol solution over the fluorine containing silicon dioxide film 108e, an about 300 nm thick fluorine containing spin-on-glass film 110c is formed on the fluorine containing silicon dioxide film 108e by evaporation of triethoxyfluorosilane.

Then, as illustrated in FIG. 4C, a second fluorine containing silicon dioxide film 110d is formed entirely over the spin-on-glass film 110c. The second fluorine containing silicon dioxide film 110d is about 400 nm thick. Then, interconnection contact holes are formed so that the wiring layer 107 appears. Then, a second wiring layer comprising a Ti film 106g, a TiN film 106c and a Cu film 107b is formed within the interconnection contact holes in the same way as that of the wiring layer 107.

In accordance with the above-mentioned method, the fluorine containing silicon dioxide film 108e as an insulating film is formed on the Cu film 107a at a temperature lower than a temperature at which copper is oxidized. In addition, the fluorine containing silicon dioxide film 108e has a lower dielectric constant than that of a silicon dioxide film. Hence, it is possible to obtain a high fabrication yield and preferred electric performance.

Japanese Unexamined Patent Publication No. 7-176612 has also suggested a method of protecting a copper wiring layer by forming a titanium containing tungsten film (hereinafter, referred to simply as "Ti—W film") on a sidewall of a copper wiring layer, and a method of forming an about 900 nm thick, fluorine containing silicon dioxide film only in a gap of a copper wiring layer at 35° C. which is lower than a temperature at which Cu is oxidized, by liquid deposition wherein oversaturated hydrosilicofluoric acid is employed.

Japanese Unexamined Patent Publication No. 63-299250 has suggested a method of protecting a surface of a copper wiring layer. The suggested method is illustrated in FIGS. 5A to 5C. First, as illustrated in FIG. 5A, a silicon dioxide film 104a is formed on a silicon substrate 101. Then, there are successively formed a Ti film 106f, a TiN film 106a, and a Cu film 107a in this order on the silicon dioxide film 104a. Then, only the Cu film 107a is patterned. Then, the TiN film 106a and the Ti film 106f are patterned with the patterned Cu film 107a being used as a mask. Thus, there is formed a copper wiring layer 107, as illustrated in FIG. 5A.

Then, as illustrated in FIG. 5B, a silicon film 109d is deposited entirely over the copper wiring layer 107 and the silicon dioxide film 104a at a thickness in the range of 10 nm to 50 nm.

Then, the product of FIG. 5B is annealed at 800° C. to 1000° C. in oxygen atmosphere. As a result, silicon contained a portion of the silicon film 109d making contact with the Cu film 107a is diffused into the Cu film 107a to thereby make Cu-Si alloy. In addition, the Cu-Si alloy absorbs oxygen contained in the oxygen atmosphere to thereby make Cu-SiO$_2$ alloy 107d. That is, SiO$_2$ penetrates grain boundary of Cu, which ensures prevention of oxidation of copper present in the Cu film 107a. A portion of the silicon film 109d making no contact with the Cu film 107a is oxidized by oxygen contained in the oxygen atmosphere, and is turned into a silicon dioxide film.

In accordance with the method illustrated in FIGS. 3A and 3B, the Cu silicide film 107c is formed around the Cu film 107a, which ensures enhancement in oxidation resistance, corrosion resistance and electro-migration resistance of the Cu film 107a. In addition, since a silicon nitride film is used as an interlayer insulating film, capacity between layers is not increased.

A wiring resistance of the Cu film 107a is dependent on specific surface area thereof against a total surface area of the Cu suicide film 107c having a high resistance. Accordingly, as the Cu film 107a is reduced in size, a ratio of a total surface area to a volume thereof is increased. This means that a smaller wiring layer in size has a higher increasing rate in a wiring resistance. A semiconductor device having a higher increasing rate in a wiring resistance inevitably has greater reduction in performance. This eliminates a merit of forming a wiring layer of copper having a low resistance.

In addition, since copper reacts rapidly with silane ($SiH_4$), it is not ready to control the reaction between Cu and $SiH_4$. Hence, it is also difficult to control a thickness of the Cu silicide film 107c, resulting in that it is difficult to obtain a uniform wiring resistance in a wafer or in a lot. This causes a problem that stable electric performance is not ensured in a semiconductor device.

In the method illustrated in FIGS. 2A and 2B, since a protection film made of silicon dioxide or similar material is formed on a sidewall of the copper wiring layer 107 when the copper wiring layer 107 is etched, and the silicon dioxide film 108d is formed on the copper wiring layer 107 employing TEOS source, it is possible to prevent oxidation of copper oxidation which would usually occur when an insulating film is formed on a copper wiring layer, and a wiring resistance is scarcely increased. In addition, a circuit delay caused by an increase of interlayer capacity does not occur.

However, the protection film to be formed on a sidewall of the copper wiring layer 107 is formed in non-equilibrium state while the Cu film 107a is being plasma-etched, and hence could have low thermal stability. This means that the ability of the protection film for preventing diffusion of copper is not so high. Furthermore, though the silicon dioxide film 108d formed by plasma-enhanced CVD employing TEOS source gas has a barrier against copper, the barrier is not so high. Accordingly, diffusion and/or oxidation of copper might occur when a plurality of annealing are carried out for fabricating a multi-layered wiring, which causes defectiveness because of current leakage between wirings, and an increase in a wiring resistance. As a result, there is caused a problem that it is quite difficult to have a high fabrication yield and long-term reliability.

The method illustrated in FIGS. 3A to 3B is surely effective for preventing copper diffusion by means of a phosphorus containing insulating film such as the PSG films 108b and 108c. However, a PSG film formed by CVD can have poor step coverage, and hence is not applicable to very fine wiring spaces.

In addition, the formation of an insulating film for prevention of copper diffusion by phosphorus ion implantation into a silicon dioxide film and annealing in POCl$_3$ atmosphere is accompanied with a major problem in respect of fabrication steps. For instance, it would take much time and much cost to implant phosphorus ion having a mol-order concentration, and it would be necessary to carry out annealing at a high temperature for introducing phosphorus into a silicon dioxide film from POCl$_3$ atmosphere. The high temperature annealing might exert a harmful influence on a transistor and/or a wiring.

When a multi-layered structure comprising silicone resin containing phosphorus at 4.0 mol % and a silicon dioxide film containing no phosphorus is to be fabricated, there are caused problems in fabrication of a multi-layered wiring and in long-term reliability of a semiconductor device, because an silicone resin is inferior to an inorganic insulating film with respect to heat resistance, designability in smaller size, and moisture resistance.

In the method illustrated in FIGS. 4A to 4C, an insulating film having a low dielectric constant is formed at a temperature lower than a temperature at which copper is oxidized, by plasma-enhanced CVD wherein triethoxyfluorosilane ($FSi(OC_2H_5)_3$) and $O_2$ gases are used as source, or by evaporation of triethoxyfluorosilane. In accordance with the method, an insulating film can be surely formed without oxidation of copper. However, the thus formed insulating film does not have a barrier performance against copper, and has poor stability because it is formed at a low temperature. Accordingly, there may be caused problems that copper is diffused because of annealing to be carried out after the formation of the insulating film, and that performance of a semiconductor device is deteriorated and long-term reliability to a semiconductor device is reduced both because of absorption of moisture thereinto.

These problems may be solved by a process including steps of covering a sidewall of a wiring layer with a Ti—W film by anisotropic etch-back after deposition of a Ti—W alloy film, and then forming an insulating film. However, this process has a problem that adjacent wirings may be short-circuited in a narrow space between wirings because of residue of a Ti—W film, and as a result, it would be difficult to have a high fabrication yield.

The method illustrated in FIGS. 5A to 5C, wherein a silicon film is deposited on a copper film, and then the product is annealed to thereby form a reaction layer, also has a problem that an annealing temperature is in the range of 800° C. to 1000° C., which is too high, and hence the method is not applicable to the formation of a wiring layer. In addition, since the Cu—$SiO_2$ layer 107d is formed, it is unavoidable that a wiring resistance is increased, which eliminates a merit that copper having a low electrical resistance is used as a wiring.

SUMMARY OF THE INVENTION

It is an object of the present invention to provide a method of fabricating a semiconductor device which method is capable of preventing an increase in electrical resistance of a copper wiring layer, enhancing oxidation resistance of a copper wiring layer, and preventing copper diffusion into an insulating film to ensure long-term reliability and an enhanced fabrication yield of a semiconductor device.

There is provided a method of fabricating a semiconductor device, including the steps of (a) forming a first insulating film on a semiconductor substrate, (b) forming a metal wiring layer on the first insulating film, (c) forming a second insulating film over both the first insulating film and the metal wiring layer at a temperature lower than a temperature at which the metal wiring layer is oxidized, and (d) implanting impurities into the second insulating film, the impurities having an ability of preventing diffusion of metal of which the metal wiring layer is made.

The method may further include the step of forming a third insulating film on the second insulating film.

The metal wiring layer may be formed of a single or multiple electrically conductive film(s). For instance, the metal wiring layer is made of copper or copper alloy. The metal wiring layer may be designed to be comprised of a first film containing metal therein and second films sandwiching the first film therebetween, the second film having an ability of preventing oxidation of the metal, an ability of preventing diffusion of the metal into the second insulating film, or an ability of ensuring adhesion between the first film and the second insulating film.

The method may further include the step of annealing the product of the step (d). It is preferable that the second insulating film is formed of a silicon dioxide film or a fluorine containing silicon dioxide film. It is also preferable that the second insulating film is formed in the step (c) by highly densified plasma enhanced chemical vapor deposition, in which plasma tetraetoxy silane or trietoxy fluoro silane is preferably used as a source.

It is preferable that the impurities to be implanted into the second insulating film in the step (d) are selected from phosphorus, boron, arsenic, lead and nitrogen solely or in combination. It is preferable that the impurities are implanted into the second insulating film by plasma doping.

For instance, the third insulating film may be formed of silicon dioxide, fluorine containing silicon dioxide, organic compound or carbon.

There is further provided a method of fabricating a semiconductor device, including the steps of (a) forming a first insulating film on a semiconductor substrate, (b) forming a recess at a surface of the first insulating film, (c) forming a metal wiring layer in the recess, (d) forming a second insulating film over both the first insulating film and the metal wiring layer at a temperature lower than a temperature at which the metal wiring layer is oxidized, and (e) implanting impurities into the second insulating film, the impurities having an ability of preventing diffusion of metal of which the metal wiring layer is made.

It is preferable that the method further includes the step of (f) planarizing the metal wiring layer formed in the recess, the step (f) being carried out between the steps (b) and (c). For instance, planarizing the metal wiring layer may be carried out by chemical mechanical polishing.

In the method in accordance with the present invention, impurities having an ability of preventing copper diffusion are implanted into an insulating film covering a copper wiring layer therewith. Thus, it is possible to enable a portion of the copper wiring layer at which copper appears to make contact with the insulating film having an ability of preventing copper diffusion. Thus, the copper wiring layer, which is surrounded by both a barrier film and Cu silicide which are effective for preventing oxidation and diffusion of copper and enhancing electro-migration resistance and stress migration resistance of copper, can be formed with high controllability, uniformity and reproducibility. Thus, it is ensured that copper is not oxidized even when an insulating film such as a silicon dioxide film which has a lower dielectric constant than that of silicon nitride, but may oxidize copper when deposited on a copper wiring layer, is formed on a copper wiring layer. This improves long-term reliability of a copper wiring layer.

In addition, even if annealed a plurality of times for fabrication of a multi-layered copper wiring layer, performance of a copper wiring layer and an insulating film is not deteriorated, which ensures that a semiconductor device having high performance and long-term reliability can be fabricated with a higher fabrication yield.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 5A to 5C are cross-sectional views of a semiconductor device, illustrating respective steps of the fifth conventional method of fabricating the same.

DESCRIPTION OF THE PREFERRED EMBODIMENTS

[First Embodiment]

Figure 1A:
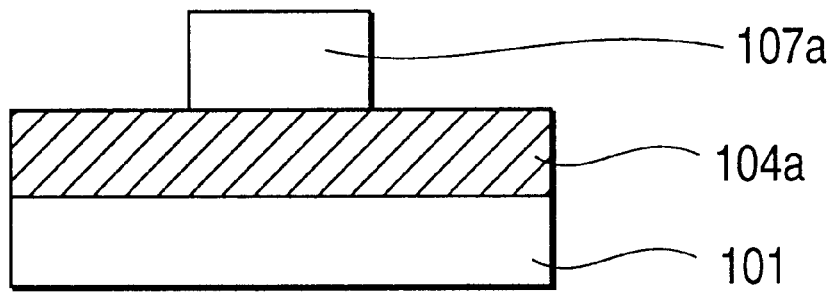
FIGS. 1A and 1B are cross-sectional views of a semiconductor device, illustrating respective steps of the first conventional method of fabricating the same.
Figure 1B:
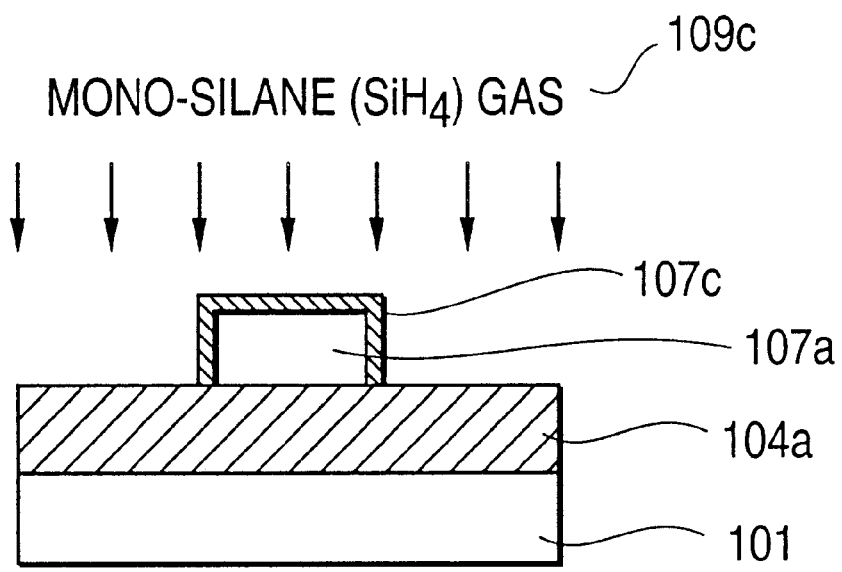
Figure 2A:
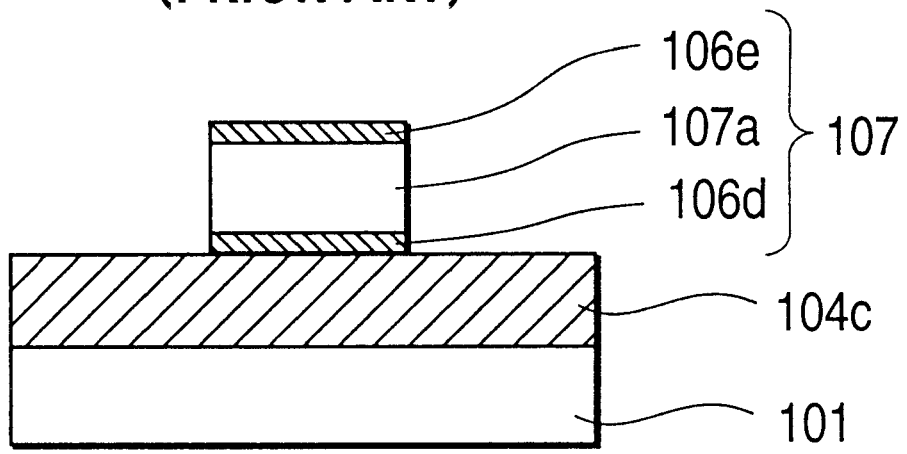
FIGS. 2A and 2B are cross-sectional views of a semiconductor device, illustrating respective steps of the second conventional method of fabricating the same.
Figure 2B:
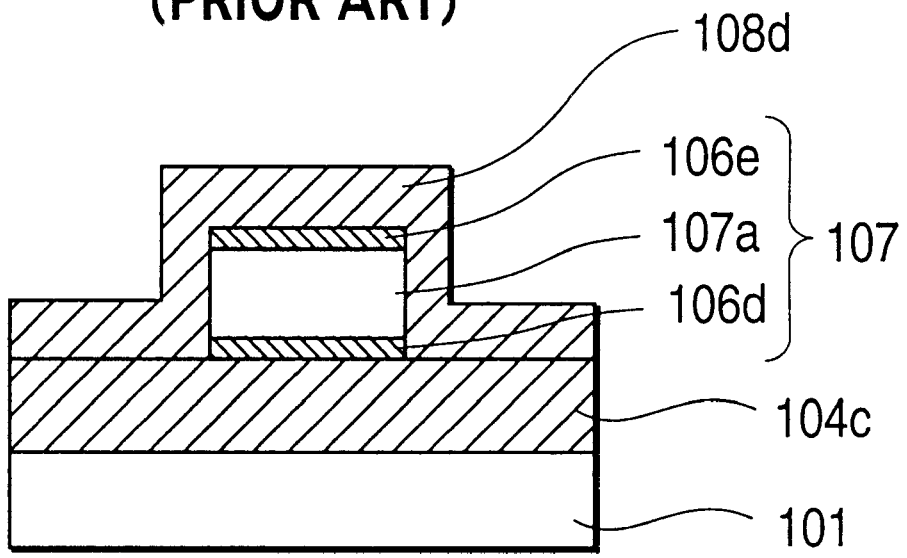
Figure 3A:
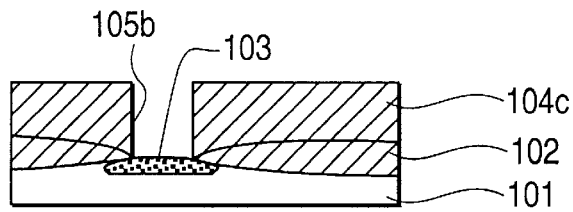
FIGS. 3A to 3D are cross-sectional views of a semiconductor device, illustrating respective steps of the third conventional method of fabricating the same.
Figure 3B:
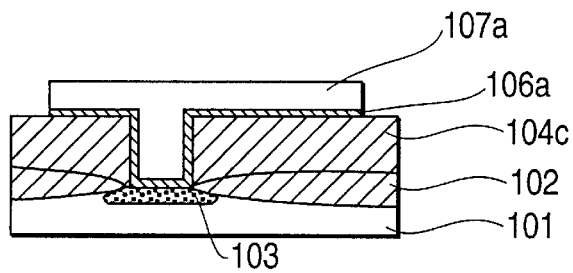
Figure 3C:
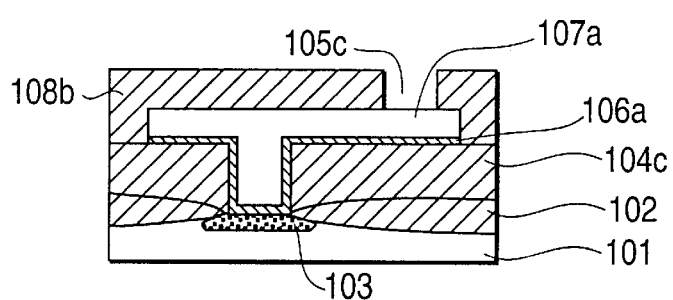
Figure 3D:
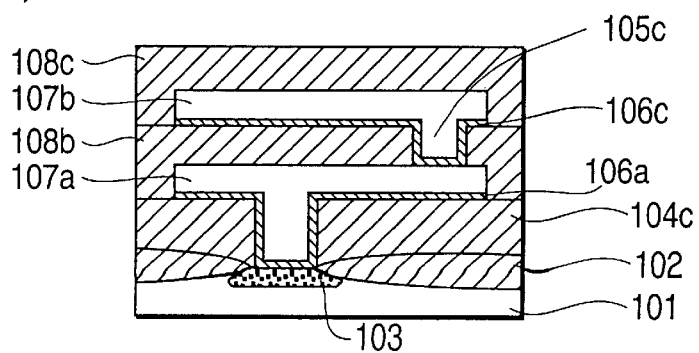
Figure 4A:
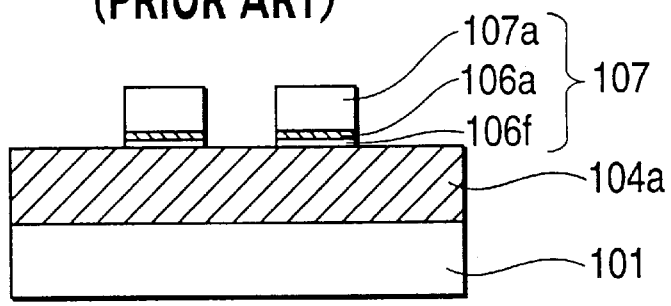
FIGS. 4A to 4C are cross-sectional views of a semiconductor device, illustrating respective steps of the fourth conventional method of fabricating the same.
Figure 4B:
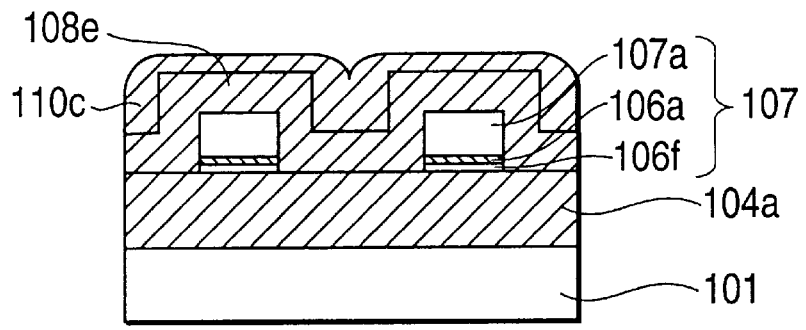
Figure 4C:
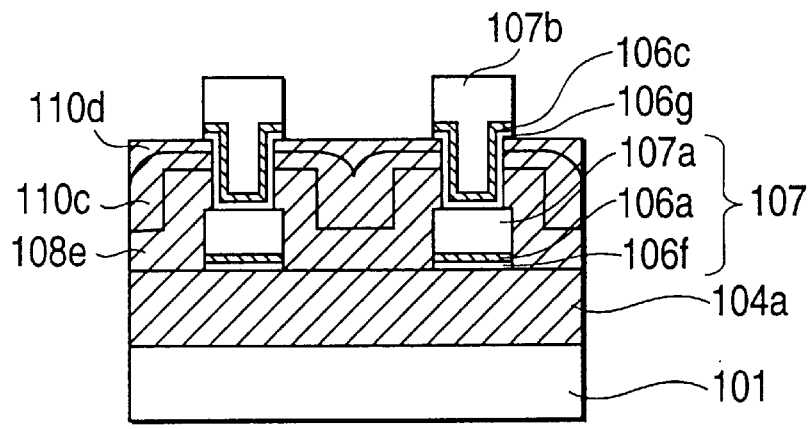
Figure 6A:
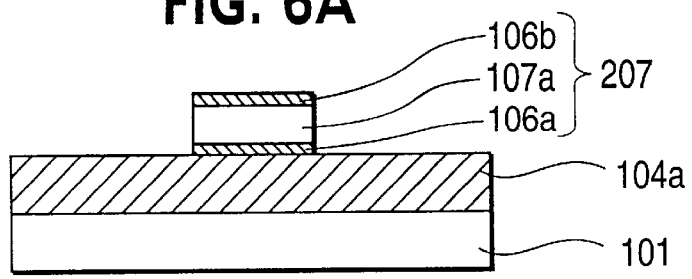
FIGS. 6A to 6D are cross-sectional views of a semiconductor device, illustrating respective steps of a method of fabricating the same in accordance with the first embodiment of the present invention.

First, as illustrated in FIG. 6A, a first silicon dioxide film 104a as a first insulating film is formed on a silicon substrate 101 by thermal oxidation or plasma-enhanced chemical vapor deposition (PECVD) wherein either $SiH_4$ and $N_2O$ or TEOS and $O_2$ are used as a source. The silicon dioxide film 104a is about 500 nm thick. The first insulating film 104a is not limited to a silicon dioxide film, and may be formed of a PSG or BPSG film which is a silicon dioxide film containing phosphorus (P) or boron (B), respectively, or of an organic film such as a polyimide film. Furthermore, the first silicon dioxide film 104a may be formed by application onto the silicon substrate 101 in place of thermal oxidation and PECVD.

Then, a first titanium nitride (TiN) film 106a as a metal film is formed on the first silicon dioxide film 104a by reactive sputtering wherein titanium (Ti) is employed as a target. The sputtering conditions are as follows.

Power: 2.5–5.0 kW

Pressure: 2–10 mTorr

Film Thickness: 25–50 nm

Then, a copper (Cu) film 107a is formed on the first TiN film 106a by sputtering in the following conditions.

Power: 2.0–5.0 kW

Pressure: 2–10 mTorr

Film Thickness: 250–500 nm

Then, a second TiN film 106b is formed on the Cu film 107a by reactive sputtering in the same condition as the first TiN film 106a. Thus, there is formed a multilayer comprising the Cu film 107a and the first and second TiN films 106a and 106b sandwiching the Cu film 107a therebetween.

The first and second TiN films 106a and 106b are formed for preventing oxidation of copper contained in the Cu film 107a and diffusion of the copper into the first silicon dioxide film 104a, and further for ensuring adhesion between the Cu film 107a and the underlying insulating film 104a. The insulating films 106a and 106b may be formed of, in place of TiN, titanium (Ti), vanadium (V), chromium (Cr), zirconium (Zr), niobium (Nb), molybdenum (Mo), hafnium (Hf), tantalum (Ta) or tungsten (W), silicide, boride, nitride or carbide thereof, or alloy containing one of the foregoing. The Cu film 107a may be replaced with a Cu alloy film mainly containing Cu, but additionally containing other elements for improving performance of the film 107a.

The deposited first TiN film 106a, Cu film 107a, and second TiN film 106b are patterned in conventional photolithography and etching. Thus, as illustrated in FIG. 6A, there is formed a wiring layer 207 on the first silicon dioxide film 104a.

Figure 6B:
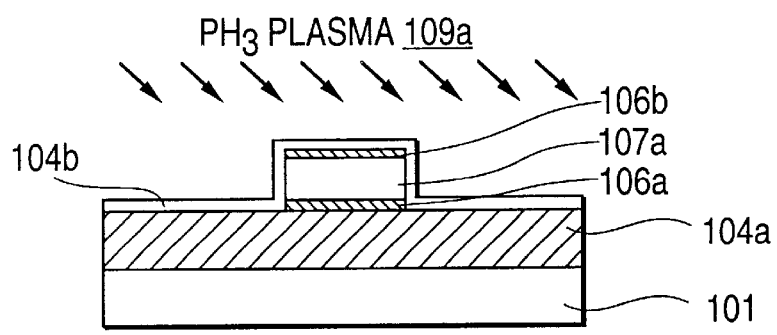

Then, as illustrated in FIG. 6B, a second silicon dioxide film 104b as a second insulating film is deposited entirely over the wiring layer 207 and the first silicon dioxide film 104a by PECVD wherein TEOS is employed as a source. The second silicon dioxide film 104b has a thickness in the range of about 20 nm to about 50 nm. The presence of TEOS causes oxidation rate of copper contained in the Cu film 107a to become quite small. The second silicon dioxide film 104b is deposited at a temperature lower than a temperature at which copper is oxidized.

In PECVD, highly densified plasma produced by electron cyclotron resonance (ECR) may be employed as plasma source, and $SiH_4$ and $O_2$ may be employed as CVD source. A spin-on-glass film may be formed by application as the second silicon dioxide film 104b. In addition, a fluorine (F) containing silicon dioxide film having a small dielectric constant may be substituted for the second silicon dioxide film 104b.

Then, the product of FIG. 6B is exposed to phosphine ($PH_3$) gas plasma in a vacuum apparatus (not illustrated). If the exposure to phosphine ($PH_3$) gas plasma were carried out in sheet form, preferred conditions are as follows.

$PH_3$ flow rate: 20–50 sccm

Temperature: 150–400° C.

Pressure: 0.1–10 Torr

Power: 0.2–1.0 kW

Exposure time: 1–5 min.

Figure 6C:
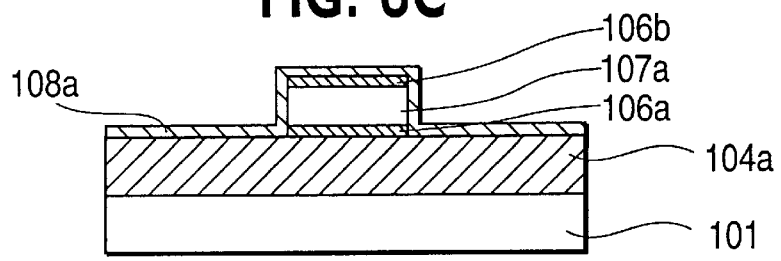

As a result, as illustrated in FIG. 6C, phosphorus (P) is introduced into the second silicon dioxide film 104b at $10^{19}$ to $10^{21}$ atoms/cm$^3$. Then, the product is annealed at 300° C. to 400° C. for about 10 to 30 minutes in inert gas atmosphere such as nitrogen atmosphere. The annealing stabilizes phosphorus atoms having been introduced into the second silicon dioxide film 104b, and as a result, the second silicon dioxide film 104b turns into an impurity containing silicon dioxide film 108a having the same or similar characteristics as that of PSG film. The impurity containing silicon dioxide film 108a has an ability of preventing diffusion of copper contained in the Cu film 107a. Thus, an exposed sidewall of the Cu film 107a in the wiring layer 207 makes contact with an insulating film having an ability of preventing copper diffusion.

An impurity element for plasma doping is not limited to abovementioned phosphorus (P). In place of phosphorus, there may be employed boron (B), arsenic (As), lead (Pb) or nitrogen (N) solely or in combination.

Figure 6D:
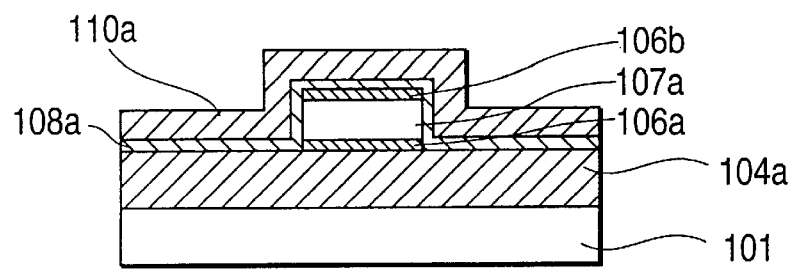

Then, as illustrated in FIG. 6D, a third silicon dioxide film 110a as a third insulating film is formed on the impurity containing silicon dioxide film 108a by a thickness in the range of 500 nm to 1000 nm, for instance, by PECVD. Similarly to the second silicon dioxide film 104b, the third insulating film is not limited to a silicon dioxide film. The third insulating film may be formed of a fluorine (F) containing silicon dioxide film having a small dielectric constant and hence effective for prevention of circuit delay, an organic compound film, or a carbon film. The third insulating film may be formed by other processes than PECVD.

The thus fabricated semiconductor device in accordance with the first embodiment is designed to include the Cu film having an exposed sidewall which makes contact with the insulating film 108a having an ability of prevention of copper diffusion. In accordance with the first embodiment, it is possible to prevent diffusion and oxidation of copper contained in the Cu film 107a.

[Second Embodiment]

Figure 7A:
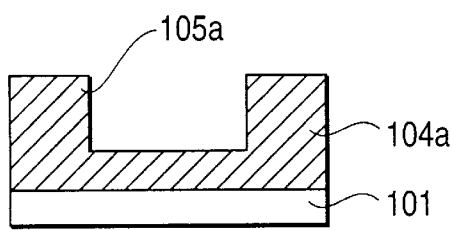
FIGS. 7A to 7F are cross-sectional views of a semiconductor device, illustrating respective steps of a method of fabricating the same in accordance with the second embodiment of the present invention.

The second embodiment is explained hereinbelow with reference to FIGS. 7A to 7F. First, as illustrated in FIG. 7A, a first silicon dioxide film 104a as a first insulating film is formed on a silicon substrate 101 by a thickness in the range of 1000 nm to 1500 nm by PECVD. Then, the first silicon dioxide film 104a is formed with a recess 105a having a width of 250 nm to 1000 nm and a depth of 250 nm to 500 nm by conventional photolithography and reactive ion etching. The first insulating film 104a is not limited to a silicon dioxide film. The first insulating film 104a may be formed of PSG or BPSG film containing phosphorus or boron, respectively. The first insulating film 104a may be formed by other processes than PECVD. For instance, the first insulating film 104a may be formed by thermal oxidation.

Figure 7B:
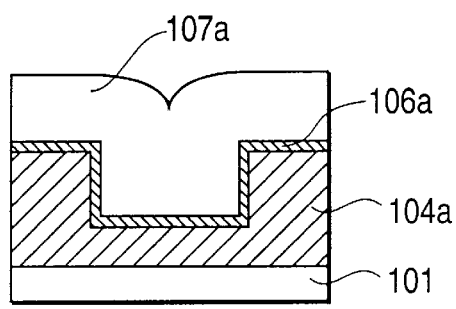

Then, as illustrated in FIG. 7B, a titanium nitride (TiN) film 106a as a metal film is formed on the first silicon dioxide film 104a by reactive sputtering wherein titanium (Ti) is employed as a target. The sputtering conditions are as follows.

Power: 2.5–5.0 kW

Pressure: 2–10 mTorr

Film Thickness: 10–30 nm

Similarly to the first embodiment, the insulating film 106a may be formed of, in place of TiN, titanium (Ti), vanadium (V), chromium (Cr), zirconium (Zr), niobium (Nb), molybdenum (Mo), hafnium (Hf), tantalum (Ta) or tungsten (W), silicide, boride, nitride or carbide thereof, or alloy containing one of the foregoing.

Then, a Cu film 107a is formed over the TiN film 106a by a thickness in the range of 500 nm to 1000 nm by Cu-CVD wherein Cu (HFA) (TMVS) (copper hexa fluoro athethylacetonate tri-methyl vinyl silane: $Cu(C_5HF_6O_2)(C_5H_{12}Si)$) is employed as organic source. Thus, the recess 105a is filled with the TiN film 106a and the Cu film 107a. It would be possible to have a flat Cu film 107a having high step coverage by carrying out Cu-CVD in the following conditions.

Source flow rate: 20–50 sccm

Carrier $H_2$ gas flow rate: 50–200 sccm

Temperature: 150–250° C.

Pressure: 5–20 Pa

Figure 7C:
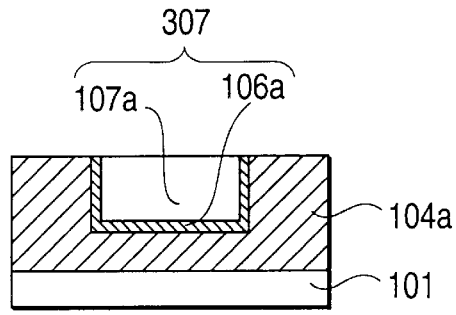

Then, as illustrated in FIG. 7C, portions of the Cu film 107a and the TiN film 106a located above the recess 105a are polished for removal by chemical mechanical polishing (CMP) wherein slurry mainly containing alumina ($Al_2O_3$) powder and hydrogen peroxide ($H_2O_2$) is used. Thus, there is formed a copper wiring layer 307 filled in the recess 105a and comprising the TiN film 106a and the Cu film 107a.

Figure 7D:
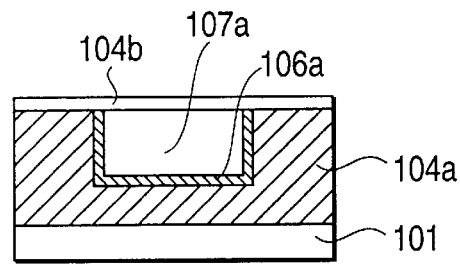

Then, as illustrated in FIG. 7D, a second silicon dioxide film 104b as a second insulating film is formed over the first silicon dioxide film 104a and the copper wiring layer 307 by a thickness in the range of about 20 nm to about 50 nm by PECVD wherein TEOS is used as a source. The presence of TEOS causes oxidation rate of an exposed surface of the Cu film 107a to become quite small. The second silicon dioxide film 104b is deposited at a temperature lower than a temperature at which copper is oxidized.

In PECVD, highly densified plasma produced by electron cyclotron resonance (ECR) may be employed as plasma source, and $SiH_4$ and $O_2$ may be employed as CVD source. A spin-on-glass film may be formed by application as the second silicon dioxide film 104b. In addition, a fluorine (F) containing silicon dioxide film having a small dielectric constant may be substituted for the second silicon dioxide film 104b.

Figure 7E:
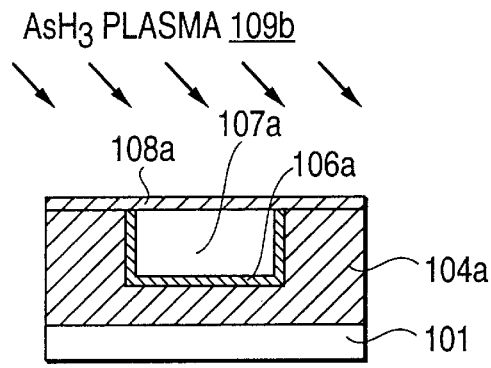

Then, the product of FIG. 7D is exposed to arsine ($AsH_3$) gas plasma in a vacuum apparatus (not illustrated), as illustrated in FIG. 7E. If the exposure to arsine ($AsH_3$) gas plasma were carried out in sheet form, preferred conditions are as follows.

$AsH_3$ flow rate: 20–50 sccm

Temperature: 150–400° C.

Pressure: 0.1–10 Torr

Power: 0.2–1.0 kW

Exposure time: 1–5 min.

As a result, arsenic (As) is introduced into the second silicon dioxide film 104b at $10^{19}$ to $10^{21}$ atoms/cm$^3$. Then, the product is annealed at 300° C. to 400° C. for about 10 to 30 minutes in inert gas atmosphere such as nitrogen atmosphere. The annealing rearranges and stabilizes arsenic atoms having been introduced into the second silicon dioxide film 104b, and as a result, the second silicon dioxide film 104b turns into an impurity containing silicon dioxide film 108a having the same or similar characteristics as that of an arsen silicate glass (ASG) film. The impurity containing silicon dioxide film 108a has an ability of preventing diffusion of copper contained in the Cu film 107a. Thus, an exposed surface of the Cu film 107a in the wiring layer 307 makes contact with an insulating film having an ability of preventing copper diffusion.

Figure 7F:
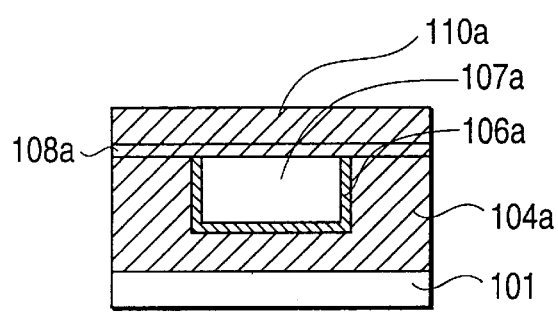

Then, as illustrated in FIG. 7F, a third silicon dioxide film 110a as a third insulating film is formed on the impurity containing silicon dioxide film 108a by a thickness in the range of 500 nm to 1000 nm, for instance, by PECVD. Similarly to the second silicon dioxide film 104b, the third insulating film 110a is not limited to a silicon dioxide film. The third insulating film 110a may be formed of a fluorine (F) containing silicon dioxide film having a small dielectric constant and hence effective for prevention of circuit delay, an organic compound film, or a carbon film. The third insulating film 110a may be formed by other processes than PECVD.

The thus fabricated semiconductor device in accordance with the second embodiment is designed to include the Cu film having an exposed surface which makes contact with the insulating film 108a having an ability of prevention of copper diffusion. Hence, it is possible to prevent diffusion and oxidation of copper contained in the Cu film 107a.

It should be noted that the above-mentioned methods in accordance with the first and second embodiments are applicable to MOS type semiconductor device, bipolar semiconductor device, and other types of semiconductor device.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-3541 filed on Jan. 13, 1997 including specification, claims, drawings and summary is incorporated herein by reference in its entirety.

What is claimed is:

1. A method of fabricating a semiconductor device, comprising the steps of:

(a) forming a first insulating film on a semiconductor substrate;

(b) forming a recess at a surface of said first insulating film;

(c) forming a metal wiring layer in said recess;

(d) forming a second insulating film over and in direct contact with both said first insulating film and said metal wiring layer at a temperature lower than a temperature at which said metal wiring layer is oxidized; and (e) implanting impurities into said second insulating film, said impurities having an ability of preventing diffusion of metal of which said metal wiring layer is made.

2. The method as set forth in claim 1, further comprising the step of (f) planarizing said metal wiring layer formed in said recess, said step (f) being carried out between said steps (b) and (c).

3. The method as set forth in claim 2, wherein said step (f) is carried out by chemical mechanical polishing.

4. The method as set forth in claim 1, further comprising the step of forming a third insulating film on said second insulating film.

5. The method as set forth in claim 1, wherein said metal wiring layer is formed of a single or multiple electrically conductive film(s).

6. The method as set forth in claim 1, wherein said metal wiring layer is comprised of a first film containing metal therein and a second film formed between said first film and an inner wall of said recess, said second film having an ability of preventing oxidation of said metal.

7. The method as set forth in claim 1, wherein said metal wiring layer is comprised of a first film containing metal therein and a second film formed between said first film and an inner wall of said recess, said second film having an ability of preventing diffusion of said metal into said first insulating film.

8. The method as set forth in claim 1, wherein said metal wiring layer is comprised of a first film containing metal therein and a second film formed between said first film and an inner wall of said recess, said second film having an ability of ensuring adhesion between said first film and said first insulating film.

9. The method as set forth in claim 1, further comprising the step of annealing the product of said step (e), said step of annealing being carried out subsequently to said step (e).

10. The method as set forth in claim 1, wherein said metal wiring layer is made of copper or copper alloy.

11. The method as set forth in claim 1, wherein said second insulating film is formed of a silicon dioxide film or a fluorine containing silicon dioxide film.

12. The method as set forth in claim 1, wherein said second insulating film is formed in said step (d) by highly densified plasma enhanced chemical vapor deposition.

13. The method as set forth in claim 12, wherein tetraetoxy silane or trietoxy fluoro silane is used as a source.

14. The method as set forth in claim 1, wherein said impurities to be implanted into said second insulating film in said step (e) are selected from phosphorus, boron, arsenic, lead and nitrogen solely or in combination.

15. The method as set forth in claim 14, wherein said impurities are implanted into said second insulating film by plasma doping.

16. The method as set forth in claim 4, wherein said third insulating film is formed of silicon dioxide, fluorine containing silicon dioxide, organic compound or carbon.

* * * * *